United States Patent [19]

Pernisz et al.

[11] Patent Number: 5,339,211

[45] Date of Patent: Aug. 16, 1994

[54] VARIABLE CAPACITOR

[75] Inventors: Udo C. Pernisz; Keith W. Michael, both of Midland, Mich.

[73] Assignee: Dow Corning Corporation, Midland, Mich.

[21] Appl. No.: 966,640

[22] Filed: Oct. 26, 1992

Related U.S. Application Data

[63] Continuation-in-part of Ser. No. 915,572, Jul. 20, 1992, Pat. No. 5,283,545, which is a continuation-in-part of Ser. No. 694,721, May 2, 1991.

[51] Int. Cl.$^5$ ............................................. H01G 7/00
[52] U.S. Cl. ........................................ 361/277; 361/281
[58] Field of Search ........................ 361/277, 280, 281

[56] References Cited

U.S. PATENT DOCUMENTS

| | | | |
|---|---|---|---|
| 3,149,398 | 9/1964 | Sprague | 29/25 |
| 3,271,591 | 9/1966 | Ovshinsky | 307/88 |
| 3,953,375 | 4/1976 | Nagano | 252/520 |
| 4,052,340 | 10/1977 | Einthoven | 252/518 |
| 4,753,855 | 6/1988 | Haluska et al. | 428/702 |
| 4,756,977 | 7/1988 | Haluska | 428/704 |
| 4,822,697 | 4/1989 | Haluska et al. | 428/698 |
| 4,847,162 | 7/1989 | Haluska et al. | 428/457 |
| 4,981,530 | 1/1991 | Clodgo et al. | 148/33.3 |
| 5,059,448 | 10/1991 | Chandra et al. | 427/557 |
| 5,151,384 | 9/1992 | Williams | 437/170 |
| 5,283,545 | 2/1994 | Pernisz | 338/308 |

FOREIGN PATENT DOCUMENTS

WO9000826  1/1990  PCT Int'l Appl. .

OTHER PUBLICATIONS

Bullot et al., Physica Status Solidi, (a) 71, K1–K4 (1982).
Ansari et al., Journal of Physics, 20, (1987), pp. 1063–1066.
Ramesham et al., NASA Tech Briefs, Dec. 1989, p. 28.
Morgan et al., Thin Solid Films, 15 (1973) pp. 123–131.
Simmons, Handbook of Thin Film Technology, Chapter 14 (1970) pp. 14–38 to 14–43.
Al-Ismail et al., Journal of Material Science, 20 (1985) pp. 2186–2192.
Morgan et al., Thin Solid Films, 20, (1974), pp. S7–S9.
Boelle et al., Applied Surface Science, 46, (1990) pp. 200–205.
Klein, Journal of Applied Physics, vol. 40, No. 7, Jun. (1969), pp. 2728–2740.

*Primary Examiner*—Bruce A. Reynolds
*Assistant Examiner*—Gregory L. Mills
*Attorney, Agent, or Firm*—James L. DeCesare; Roger E. Gobrogge

[57] ABSTRACT

An electrical or electronic circuit having at least one variable capacitor device connected in parallel relationship in the circuit by at least a pair of electrodes. The improvement constitutes the capacitor device being in the form of a silicon dioxide film derived from the oxidation of a hydrogen silsequioxane resin. The silicon dioxide film is characterized by a non-linear substantially symmetrical jV curve which includes a threshold voltage at which the silicon dioxide film undergoes a reversible transition from insulating to conducting. The jV curve further includes a regime of negative differential resistance in which an increase in the voltage applied to the silicon dioxide film above the threshold voltage causes a decrease of the current.

14 Claims, 5 Drawing Sheets

VARIABLE CAPACITOR

RELATED U.S. PATENT APPLICATIONS

This application is a continuation-in-part of prior copending application U.S. Ser. No. 07/915,572, now U.S. Pat. No. 5,283,545 filed Jul. 20, 1992, entitled "Variable Resistors", which is in turn a continuation-in-part of an original parent copending application U.S. Ser. No. 07/694,721 filed May 2, 1991, entitled "Threshold Switching Device". Both of the prior applications are assigned to the same assignee as the present application.

BACKGROUND OF THE INVENTION

This invention relates to a method of forming threshold switching devices which exhibit negative differential resistance (NDR) and to the devices formed thereby. The method comprises depositing a silicon dioxide film derived from hydrogen silsesquioxane resin between at least two electrodes and applying a voltage above a threshold voltage across the electrodes. Such devices are useful as variable resistors and variable capacitors.

Numerous devices which exhibit threshold switching are known in the art. For example, Ovshinsky, in U.S. Pat. No. 3,271,591, issued Sep. 6, 1966, describes such devices in which semiconductor materials, such as crystalline or amorphous tellurides, selenides, sulfides or oxides of substantially any metal, are deposited between electrodes. The semiconductors and methods specifically set forth in this reference, however, are not the same as those claimed herein. As is well known in the art, current-voltage or IV curves are graphical representations of plots of measured values of the current I through a particular material or a device, as a function of the applied voltage V. In many instances, it is more convenient to illustrate current in terms of current density "j". Thus, current density is expressed as $j=I/A$ in which "A" is the surface area of a device expressed in square centimeters, As such, the jV curves in this reference differ from those of the present application.

Threshold switching with negative differential resistance is also known in various metal oxide thin films. For instance, Bullot et al., Physica Status Solidi (a) 71, K1 (1982), describe threshold switching in vanadium oxide layers deposited from gels; Ansari et al., Journal of Physics 20 (1987) 1063-1066 describe threshold switching in titanium oxide films formed by thermally oxidizing a titanium metal layer; Ramesham et el., NASA Tach Briefs, December 1989, p. 28, describe the switching in manganese oxide films; and Morgan et al., Thin Solid Films, 15 (1973) 123-131, describe switching and negative differential resistance in aluminum oxide films. The materials and characteristics described in these references, however, differ from those described herein.

The switching and negative differential resistance characteristics of silicon oxide films have likewise been described. For instance, Simmons, Handbook of Thin Film Technology, Chapter 14 (1970), Pages 14-38 to 14-43, describes electronic conduction through thin insulating films, including silicon oxide, as well as their negative resistance and memory characteristics; Al-Ismail et al., Journal of Material Science, 20 (1985) 2186-2192, describe switching and negative resistance in a copper-silicon oxide-copper system; Morgan et al., Thin Solid Films, 20 (1974) S7-S9, describe threshold switching and memory in silicon oxide films; Boelle et al., Applied Surface Science 46 (1990) 200-205, describe the current-voltage characteristics of silica films derived from sol-gel low temperature methods; and Klein, Journal of Applied Physics, Volume 40, Number 7, June (1969) 2728-2740, describe the electrical breakdown of silicon oxide films. As with the prior metal oxide references, however, these too do not describe the methods and characteristics described herein.

Resistors produced form ceramic oxides are also known in the art. For instance, Eijnthoven in U.S. Pat. No. 4,052,340 issued Oct. 4, 1977, and Nagano in U.S. Pat. No. 3,953,375 issued Apr. 27, 1966, describe resistors derived primarily from zinc oxide and titanium oxide, respectively. Such materials and the resultant properties, however, differ from those claimed herein.

Thin film silica coatings derived from hydrogen silsesquioxane resin are also known in the art. For instance, Haluska in U.S. Pat. No. 4,756,977 issued Jul. 12, 1988 describes forming such films by diluting hydrogen silsesquioxane resin in a solvent, applying the solution to a substrate, drying the solvent, and heating. Such coatings are taught therein to provide protection and electrical insulation.

The present inventors have now found that switching devices with desirable features can be formed by depositing a thin, hydrogen silsesquioxane derived silicon dioxide film between at least 2 electrodes and applying a voltage above a threshold voltage across the electrodes. These devices are useful as variable resistors and variable capacitors.

While silicon dioxide capacitors are described in the patent literature, such capacitors do not possess the same properties as the capacitors of the present invention. This is for the reason that the silicon dioxide films of the prior art are manufactured by processes which differ significantly from the process of the present invention. For example, U.S. Pat. No. 3,149,398 issued Sep. 22, 1964, discloses a silicon dioxide capacitor in which the silicon dioxide layer is formed by the decomposition of an alkyltrialkoxysilane such as ethyltriethoxysilane. The U.S. Pat. No. '398 patent includes an alternate method of producing the silicon dioxide layer by dissociation of silicon tetrachloride to a silicon deposit which is converted to silicon dioxide by oxidation. Further, the U.S. Pat. No. '398 patent notes that the layer may be formed by either the direct deposition of silicon dioxide by evaporation, or the evaporation of silicon monoxide onto a substrate followed by oxidation of the deposit to silicon dioxide. However, there is nothing in the U.S. Pat. No. '398 patent to indicate that the silicon dioxide layers produced therein possess the unique characteristics of the silicon dioxide capacitor films produced by the method employed in accordance with the teaching of the present invention.

SUMMARY OF THE INVENTION

The present invention relates to a method of forming a threshold switching device having negative differential resistance (NDR). The method comprises depositing a non-dense silicon dioxide film derived from hydrogen silsesquioxane resin between at least two electrodes. A voltage above a certain threshold voltage is then applied across the electrodes to complete formation of the device.

The device formed in this manner is characterized in that (i) the conductive state of the thin film can be converted to the resistive state with memory by decreasing the applied voltage from a sufficiently high value to a value below the threshold voltage at a sufficiently high rate, (ii) it can be converted from a resistive state to a conductive state with memory by the application of a threshold voltage, (iii) the application of voltage above a threshold voltage results in the film exhibiting stable negative differential resistance, and (iv) the conductive and resistive states have different capacitance values associated therewith.

The present invention also relates to variable resistors and variable capacitors in which at least two leads are in direct contact with a material which is silica derived from a hydrogen silsesquioxane resin.

In particular, the present invention is directed to an electrical or electronic circuit having at least one capacitor device connected in the circuit by at least a pair of electrodes. The improvement relates to a variable capacitor device in the form of a silicon dioxide film derived from the oxidation of a hydrogen silsesquioxane resin. The silicon dioxide film is characterized by a jV curve which exhibits both linear and non-linear regions for the device. For example, the jV curve of the silicon dioxide film includes: (i) a first non-linear region wherein increasing the voltage applied to the device increases the current to a current maximum, at which time a measurement of the capacitance of the device shows a high value and a strong dependence on the applied bias; followed by (ii) a second non-linear region of a negative differential resistance wherein increasing the voltage applied to the device decreases the current to a current minimum while the voltage is increasing. The jV curve of the silicon dioxide film includes (iii) a third region capable of being activated by a voltage in excess of tile voltage at the current minimum, at which time a rapid removal of the excess voltage causes the current to decrease in an essentially linear fashion which switches the capacitance of the device from the high value and the strong dependence on the applied bias to a low value and a weak dependence on the applied bias. The jV curve of the silicon dioxide film further includes (iv) a fourth region wherein an increase of the voltage applied to the device up to a threshold voltage causes a rapid transition from a linear current increase to a non-linear current increase which continues to a current maximum.

These and other features, objects, and advantages, of the present invention will become more apparent from a consideration of the detailed description of the invention.

BRIEF DESCRIPTION OF THE DRAWINGS

FIG. 1 shows the device in its simplest form.

DETAILED DESCRIPTION OF THE INVENTION

The present invention is based on the discovery that thin films of silicon dioxide derived from hydrogen silsesquioxane resin thin films exhibit novel threshold switching and negative differential resistance (NDR). This was particularly unexpected since the thin films herein are conventionally used as electrical insulation materials.

These devices show features beyond those taught in the prior art. For instance:

1. The devices carry high current density;
2. The devices have been shown to operate with thick films of about one micron whereas the prior art teaches that the effect does not occur in films greater than about 500 nanometer thick; and 3. The entire jV curve, especially the negative differential resistance region (NDR), has been shown to be stable and monotonic.

As used in this disclosure, the term "hydrogen silsesquioxane resin" is intended to include those resins which are fully condensed (HSiO$_{3/2}$)$_n$ as well as those which are only partially hydrolyzed and/or partially condensed, and which may contain residual SiOR and/or SiOH substituents wherein OR is a hydrolyzable group; and the expression "thin film" is used to describe the silicon dioxide films derived from hydrogen silsesquioxane.

Figure 1:
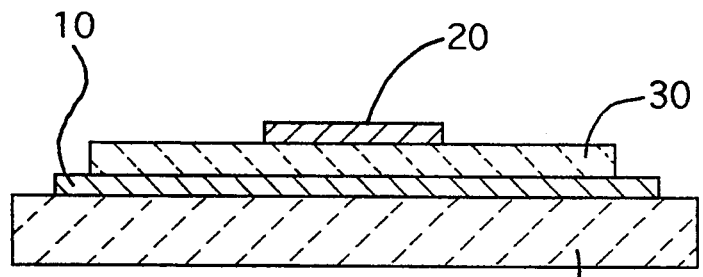
FIG. 1 is pictorial representation and a side view of a cross section of a sandwich device according to the present invention.

The invention will be described with specific reference to the drawing figures. FIG. 1 is a cross-sectional view of a representative threshold switching device, or variable capacitor of this invention wherein electrodes 10 and 20 are separated by the thin film 30. Although this Figure exemplifies a sandwich electrode configuration, including a substrate 40 such as glass, such an arrangement is not critical and nearly any configuration appropriate for a given device application may be used. For example, arrangements such as coplanar, transplanar, crossed grid arrays, and two dimensional circular dot patterns may be used.

The shape of the electrodes 10 and 20 and the materials from which they are constructed may be any conventionally known in the art. For instance, the electrodes can be made of nearly any electrically conductive or semiconductive material such as gold, silver, aluminum, platinum, copper, gallium arsenide, chromium, and silicon. Likewise, the electrodes can be used in nearly any shape or form desired, such as a wire or a conventional lead, provided they have at least enough device area to enable the desired current flow. Particularly preferred herein is the use of gold electrodes.

Contact between the electrodes 10 and 20 and the thin film 30 can be established by techniques well known in the art. For instance, the electrodes may be formed on the thin film by evaporating or sputtering the appropriate electrode material in vacuum. Alternatively, the thin film 30 may be deposited directly onto preformed electrodes to create the appropriate contact, or the preformed electrodes may be adhered to the thin film by conventional techniques.

The thin films 30 of this invention are silicon dioxide derived from hydrogen silsesquioxane resin. Generally, these films may be of any thickness desired. Those in the range of between about 50 and 5,000 nanometer are preferred with those in the range of between about 100 and 600 nanometer being especially preferred.

Such thin films 30 may be formed by any appropriate method. A particularly preferred technique comprises coating a substrate with a solution comprising a solvent and hydrogen silsesquioxane resin, evaporating the solvent to form a preceramic coating, and then converting the preceramic coating to a thin film. Other equivalent methods, however, are also contemplated herein.

Silica thin films can be prepared from a hydrogen silsesquioxane resin by low-temperature oxidation (air pyrolysis). The resin is a hydrido-silsesquioxane with the formula

[HSiO$_{3/2}$]$_n$.

This resin consists of cages formed from rings based on the tri-functional (T) unit ≡SiO—. Rings containing four, five, six, and more such T units are known. These n-SiO rings form regular cage-like structures identified by the number of T units and the cages form the resinous polymer. At elevated temperature and in the presence of an oxidizing species such as oxygen (air), the silsesquioxane is converted to silica according to the net reaction:

$$2\ HSiO_{3/2} + O_2 \rightarrow 2\ SiO_2 + H_2O^{(g)}.$$

This reaction can be initiated at temperatures below those needed to prepare silica, and conversion has been observed at temperatures as low as 150° C., but usually a temperature of 400° C. is employed. The formation of a completely cross-linked silica structure is via the formation of silanol in a first reaction step from which other reactions proceed to pure silica. Examples of the second stage reactions include rearrangement of bonds according to:

$$2\ HSiO_{3/2} + O_2 \rightarrow 2HO\text{—}SiO_{3/2}$$

$$2\ HO\text{—}SiO_{3/2} \rightarrow 2\ SiO_2 + H_2O$$

where two silanols react with each other, and:

$$2\ HSiO_{3/2} + O_2 \rightarrow 2\ HO\text{—}SiO_{3/2}$$

$$HO\text{—}SiO_{3/2} + HSiO_{3/2} \rightarrow 2\ SiO_2 + H_2$$

where a silanol reacts with another silsesquioxane moiety, generating silica. Depending on the temperature, the hydrogen reacts with oxygen to form water, or it escapes.

As defined above, the hydrogen silsesquioxane resins which may be used in this invention are those with the structure (HSiO$_{3/2}$)$_n$. Such resins are generally produced by the hydrolysis and condensation of silanes of the formula HSiX$_3$, wherein X is a hydrolyzable group, and they may be either fully hydrolyzed and condensed (HSiO$_{3/2}$)$_n$ or their hydrolysis or condensation may be interrupted at an intermediate point such that partial hydrolyzates which contain Si—OR groups wherein OR is a hydrolyzable group and/or partial condensates which contain SiOH groups are formed. Although not represented by this structure, these resins may contain a small percentage of silicon atoms which have either no hydrogen atoms or more than one hydrogen atom attached thereto due to various factors involved in their formation or handling.

Various methods for the production of these hydrogen silsesquioxane resins have been developed. For instance, Collins in U.S. Pat. No. 3,615,272, which is incorporated herein by reference, describes a process of forming nearly fully condensed resins which may contain up to 100-300 ppm silanol by hydrolyzing trichlorosilane in a benzene sulfonic acid hydrate hydrolysis medium, and washing the resultant resin with water or aqueous sulfuric acid. The resultant polymeric material has units of the formula (HSiO$_{3/2}$)$_n$ in which n is generally 8-1000 and has a number average molecular weight of from about 800-2900 dalton, and a weight average molecular weight of between about 8000-28,000 dalton.

Similarly, Bank in U.S. Pat. No. 5,010,159 hereby incorporated by reference, teaches methods of forming such resins which may contain up to 1000 ppm silanol by hydrolyzing hydridosilanes in an arylsulfonic acid hydrate hydrolysis medium to form a resin, and contacting the resin with a neutralizing agent. A preferred embodiment of the Bank process uses an acid to silane ratio of about 6/1.

Other methods which may be used are described by Frye in U.S. Pat. No. 4,999,397, hereby incorporated by reference, and include hydrolyzing trichlorosilane in a non-sulfur containing polar organic solvent by the addition of water or HCl and a metal oxide or a method which comprises hydrolyzing a hydrocarbonoxy hydridosilane with water in an acidified oxygen-containing polar organic solvent, to produce hydridosiloxane resins.

The next phase of the process is to deposit the hydrogen silsesquioxane on the surface of a substrate. This can be accomplished in any manner, but a preferred method involves dissolving the hydrogen silsesquioxane resin in a solvent to form a solution, and then applying this solution to the surface of the substrate where the solvent evaporates. Various facilitating measures such as stirring and/or heating may be used to aid in the dissolution. Solvents which may be used include any agent or mixture of agents which will dissolve the resin to form a homogenous solution without affecting the thin film or its switching properties. These solvents can include, for example, alcohols such as ethanol or isopropanol; aromatic hydrocarbons such as benzene or toluene; alkanes such as n-heptane or dodecane; ketones; esters; glycol ethers; or cyclic dimethylpolysiloxanes; in all amount sufficient to dissolve the above materials to a low content of solids. Generally, an amount of solvent is used to form a 0.1–50 weight percent solution.

In addition to the hydrogen silsesquioxane resin, the coating solution may also include a modifying ceramic oxide precursor, such that the resultant ceramic coating comprises a mixed silicon/metal oxide. Such precursors can include, for example, compounds of various metals, such as iron, aluminum, titanium, zirconium, tantalum, niobium and/or vanadium. These compounds generally form either solutions or dispersion when mixed with the resin and must be capable of being subsequently pyrolyzed at relatively low temperatures and relatively rapid reaction rates to form modifying ceramic oxide coatings. When such a modifying ceramic oxide precursor is used, it is generally present in the preceramic mixture in an amount such that the final coating contains 0.1 to 30% by weight of the modifying ceramic oxide.

Examples of modifying ceramic oxide precursors include tetra n-propoxy zirconium, tetraisobutoxy titanium, aluminum trispentanedionate, pentaethoxy tantalum, tripropoxy vanadium, pentaethoxy niobium, zirconium pentanedionate, and titanium dibutoxy bispentanedionate.

If modifying ceramic oxide precursors are to be included in the resin preceramic solution, they may be simply dissolved in the solution of the hydrogen silsesquioxane resin and the solvent, and allowed to stand at room temperature for a time sufficient to allow the modifying ceramic oxide precursor to react into the structure of the resin. Generally, a period of greater than about two hours is necessary for said reaction to occur. The solution may then be applied to the substrate as discussed above. Alternatively, the modifying ceramic oxide precursor may be hydrolyzed or partially hydrolyzed, dissolved in the solution of the solvent and resin and then immediately applied to the substrate. Various facilitating measures such as stirring or agitation may be used as necessary to produce said solutions.

A platinum, rhodium or copper catalyst may also be used to increase the rate and extent of hydrogen silsesquioxane resin conversion to silicon dioxide. Generally, any platinum, rhodium or copper compound or complex which can be solubilized will suffice. For instance, a composition such as platinum acetylacetonate, a rhodium catalyst such as $RhCl_3[S(CH_2CH_2CH_2CH_3)_2]_3$, or cupric naphthenate, are all within the scope of this invention. These catalysts are generally added in an amount of between about 5 to 1000 ppm platinum, rhodium or copper based on the weight of the resin.

If the above solution method is used, the coating solution is applied by techniques such as spin coating, dip coating, spray coating, or flow coating, and the solvent is allowed to evaporate. Any suitable means of evaporation may be used such as simple air drying by exposure to an ambient environment, or by the application of a vacuum or mild heat.

The resultant preceramic coating is then converted to the silicon dioxide thin film. Generally, this is carried out at a temperature and in an environment which will not result in the formation of a fully dense silica film (2.2 $g/cm^3$). For instance, such silicon dioxide films may be formed by heating the preceramic coating in air at a temperature of from about 100° to about 600° C. For other environments such as ammonia, oxygen, and nitrogen, however, the temperature may vary.

It is important that the resultant thin film is not completely dense so that the observed behavior can occur. The exact density, however, is not critical and can vary over a wide range. Generally, the density is in the range of between about 40 and 95%, with densities in the range of between about 60 and 90% being preferred.

After the thin film 30 is formed, the necessary electrodes 10 and 20 are attached in the manner described above such that a voltage can be applied across the thin film.

A device prepared in this manner initially exhibits an undefined, non-specific resistance. For instance, some devices may exhibit resistance values as low as one ohm while others exhibit values above ten megobus. Those with very low resistance often have shorts between the electrodes due to pin holes and other flaws. If present, such shorts may be "blown out" by applying a voltage sufficiently high to vaporize the electrode around the short of about 10–20 volts from a low impedance voltage source.

A voltage is then slowly applied across the film of the device and increased until a threshold voltage is reached, at which point, the resistance of the device suddenly falls. Upon such a voltage application, the device is completely formed and it will remain in its low resistance state.

To obtain lower threshold voltages and more reproducible results, the devices of the invention may be placed in a non-oxidizing environment. Examples of suitable environments include nitrogen, argon, helium, and carbon dioxide. Alternatively, however, establishing a vacuum or encapsulating the device can also provide the desired non-oxidizing environment.

The following discussion describes the characteristics of a typical device formed in the above manner, and the procedures to switch the device from its OFF state to an ON state and back again. A typical device includes a silica thin film 30 with a thickness of about 200 nanometer and a device area of about 0.1 $cm^2$. A voltage is applied across the electrodes, and the current through the device and the voltage across the device are measured. The current, measured in ampere (A) is converted to a current density j and reported as A/cm². The results are plotted in a diagram of current density versus voltage referred to as a jV curve. The values set forth herein are only representative of a typical device and are not meant to be limiting.

Threshold switching, as displayed by this device, is similar to that known in the art for other thin films. As a voltage less than a threshold voltage of about three volts is applied to an electrode, tile thin film exhibits a high impedance as would normally be associated with an insulator. The resistivity of the device in this "OFF" state is generally in the range of between about $10^8$ ohm cm and about $10^{11}$ ohm cm. When the applied voltage is raised above the threshold voltage however, the thin film is rapidly converted to a state of low resistivity, and the device supports a high current density. The resistivity in this "ON" skate is typically in the range of between about $10^4$ ohm cm and about $10^7$ ohm cm.

Figure 2:
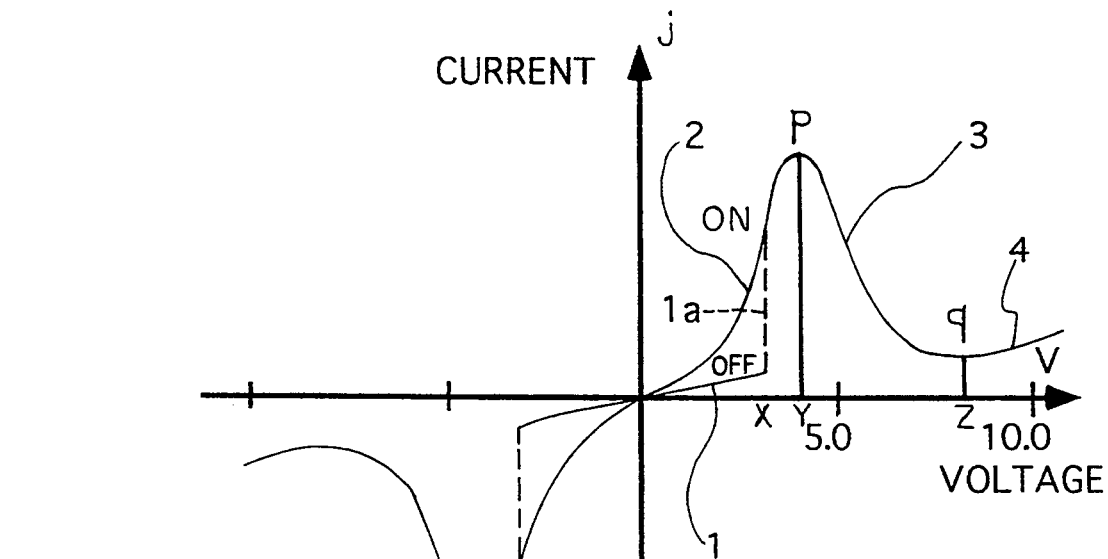
FIG. 2 is a graphical representation in the form of a jV plot of the current density versus the voltage of a device of the present invention illustrating the threshold switching behavior of the device. Current density j is defined as the current in ampere units divided by the surface area of the device in square centimeters.

This threshold switching behavior is graphically displayed in FIG. 2. Line 1 shows that when the device is in the OFF state, the current density increases only slightly as the applied voltage is increased. When the applied voltage reaches the threshold voltage "x" the device rapidly switches from the OFF state to the ON state wherein the current density is suddenly increased by two or three orders of magnitude or more shown by the dotted line. It is essential for the transition to the ON state to occur as depicted schematically in FIG. 2 that the ambient of the device be free of oxygen or other oxidizing gaseous species. This condition pertains throughout the remainder of the discussion of the resistive properties of devices according to this invention.

Once in the ON state, the jV tracing follows lines 2, 3 and 4 wherein the current rises steeply with voltage in the first quadrant as shown by line 2 and symmetrically to it in the third quadrant until it reaches a maximum current "p" at a voltage "y". Increasing the voltage beyond this value results in a decrease in current density until a minimum "q" is reached at voltage "z", at which time the device exhibits a voltage controlled negative differential resistance, or NDR as shown by line 3. Typically the values for "y" range between 4–6 V and for "z" between 8–10 V. At voltages above "z", the jV curve shows the high resistivity characteristic of an insulator which is shown as line 4.

One advantage of a device of this invention is the fact that the jV curve is wide and "stable" in the NDR region, such that no uncontrollable transitions occur as the applied voltage is changed, although the jV curve is noisier in the NDR than in the low voltage portion shown as line 2. Thus, any point on the jV curve can be isolated and maintained, provided the source impedance of the voltage supply is smaller by magnitude than the negative differential resistance of the device at that point.

The jV curve of the device in its ON state can be completely traced out for both increasing and decreasing voltages, through the maximum, at a sufficiently low rate of change of the applied voltage. In particular, the curve is continuous through the origin which means (i) there is no holding current necessary to maintain the ON state, and (ii) the device has a "memory" of the ON state even when no voltage is applied.

Figure 3:
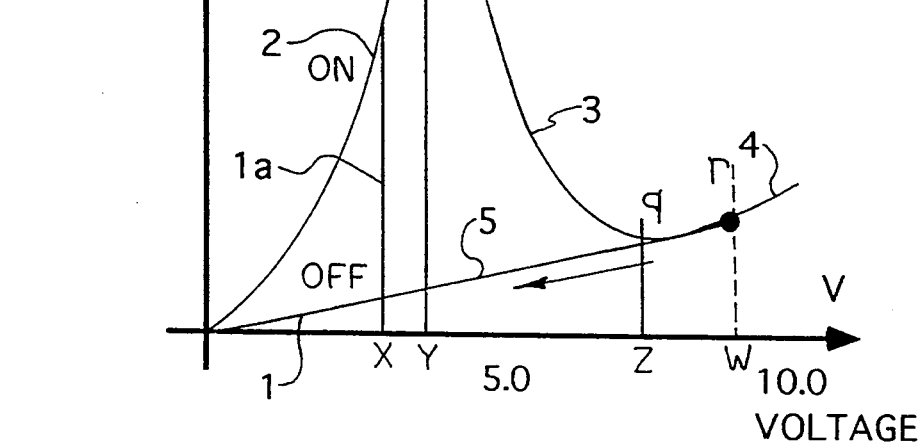
FIG. 3 is graphical representation of a portion of the jV plot of FIG. 2 in more detail.

To convert the device from tile ON state to the OFF state requires that the applied voltage be removed or reduced to a value of about zero at a sufficiently high "slew rate" from a voltage above "z" As shown in FIG. 3, the jV curve of the device does not go through the current peak "p" when the applied voltage is rapidly lowered in this manner. Rather, it follows a direct nearly linear path shown by line 5. Slew rates for efficiently switching the device OFF are greater than about one volt per millisecond with rates greater than about 1000 V/mS being preferred. It is to be noted that a device in the ON state may be turned OFF by a voltage pulse starting at zero, provided the pulse voltage is larger, or approximately equal to "z" wherein the pulse reaches line 4, and the fall time of the pulse meets the slew rate requirement. Typically, a voltage of ten volts for a duration of one microsecond or longer is adequate.

When the device is turned OFF in the above manner, it has a high resistance, typically two or three orders of magnitude higher than its resistance in the ON state. The resistance can be determined by measuring the jV curve in the OFF state over a small range of the applied voltage up to the threshold voltage. The device will remain in the OFF state as long as the applied voltage does not exceed the threshold voltage. Such a device in the OFF state can be converted to the ON state as described above.

Figure 8:
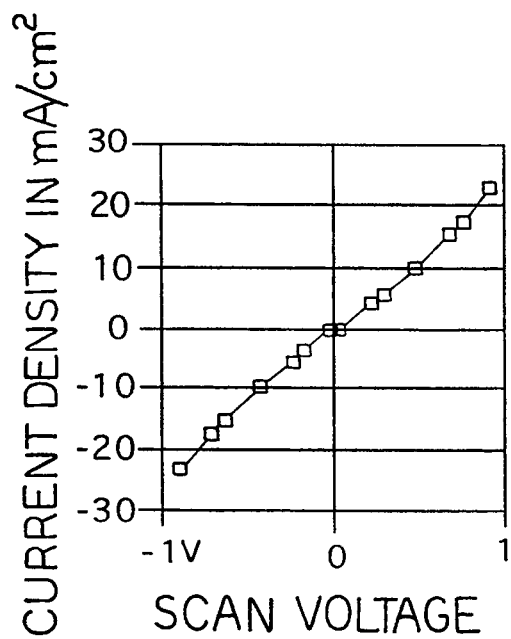
FIG. 8 is a graphical representation in the form of a jV plot of a device of the present invention having an area of 0.15 square centimeters illustrating a probe scan of the ON state of such a device.
Figure 9:
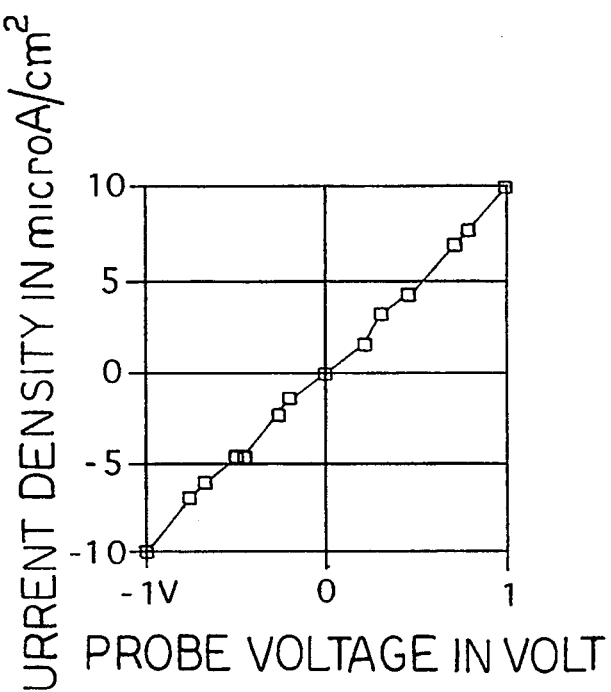
FIG. 9 is similar to FIG. 8 but in the form of a graphical representation of a jV plot of a device of the present invention having an area of 0.15 square centimeters illustrating a probe scan of the OFF state of such a device.

Both the ON state and the OFF state of a device are illustrated in FIGS. 8 and 9 respectively, which show measurements of the jV characteristics over a range of the applied voltage between $-1$ V and $+1$ V. From the device area A (0.15 cm²) and the current densities $j_{ON}$ and $j_{OFF}$ obtained at a specific voltage, for instance $U=1$ V, the resistance $R_{ON}$ and $R_{OFF}$ of the device in its two states can be calculated as:

$$R_{ON} = U/j_{ON}A$$

and $$R_{OFF} = U/j_{OFF}A.$$

With the values from FIGS. 8 and 9, the ON resistance is calculated as 270 ohms, while for the OFF resistance the value is 670 kilo-ohm. The resistance ratio achieved with this device is 2480.

As set forth above, these resistances can be readily interchanged by the application of appropriate voltage pulses. At voltages below the threshold voltage, the resistance values of the device are stable.

Figure 13:
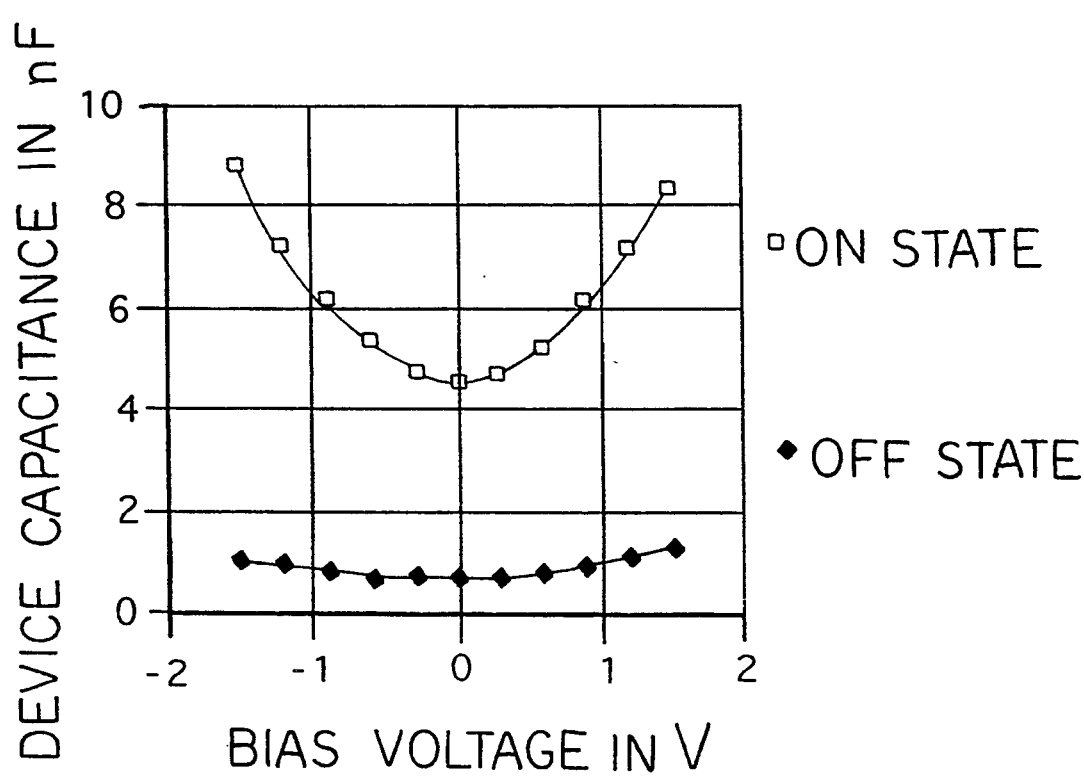
FIG. 13 is a graphical representation of a measurement of the capacitance of the device of FIG. 12 with the device in its ON and OFF state, as a function of a bias of between $-1.5$ volts and $+1.5$ volts. The measurement was performed at a frequency of 10 kHz.

It has been found that the ON state and the OFF state of the device are each associated with different capacitance values. For example, FIG. 13 shows measurements of the device capacitance as a function of the applied bias voltage for both the ON and the OFF states of the device. The transition from the ON state high capacitance to the OFF state low capacitance is effected by the application to the device of a pulse voltage, as described previously for switching the device from ON to OFF.

The effects described above suggest applications for these devices as switches, sensors, and memory elements. In particular, the device is useful as a voltage pulse controlled variable resistor or a variable capacitor.

It has been determined that the application of voltage pulses that vary between the threshold voltage "x" in FIG. 3 and the current minimum at point "q" at "z" volts in FIG. 3 results in device resistances ranging between the fully ON and the fully OFF state by comparing FIGS. 8 and 9.

Figure 10:
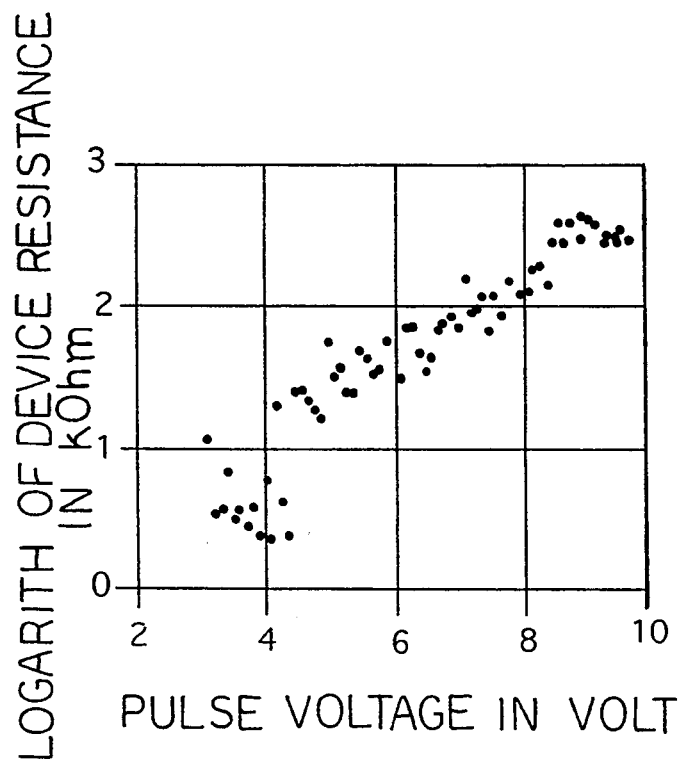
FIG. 10 is a graphical representation in a semilogarithmic plot of the pulse voltage versus resistance of a device of the present invention to depict graphically the functional relationship between the pulse voltage and the resistance.

FIG. 10 depicts the functional dependence of the resistance of the device on the pulse voltage. The resistance data are plotted logarithmically (base 10) on the ordinate axis. FIG. 10 shows that the resistance increases with increasing pulse voltage, covering a continuous range of resistance values of more than two orders of magnitude.

Utilizing the device as a continuous variable resistor according to the present invention is particularly advantageous since a wide range of resistance values can be achieved using only two electrodes. By contrast, prior art techniques require either mechanical manipulation or additional control electrodes to alter the resistance of a variable resistor.

Although the mechanism for the effects described above is not fully known, it is believed that the nanostructure of the thin film is essential for switching and for negative differential resistance. In particular, the structure of the electronic states associated with the internal surfaces of silicon dioxide derived from hydrogen silsesquioxane are believed to be responsible for the behavior of the material. The mechanism for switching between the ON and OFF states is believed to be a solid-state electrochemical redox reaction involving the electronic states discussed above.

The following Examples are set forth to illustrate in more detail the concepts embodied in the present invention.

EXAMPLE 1

Figure 4:
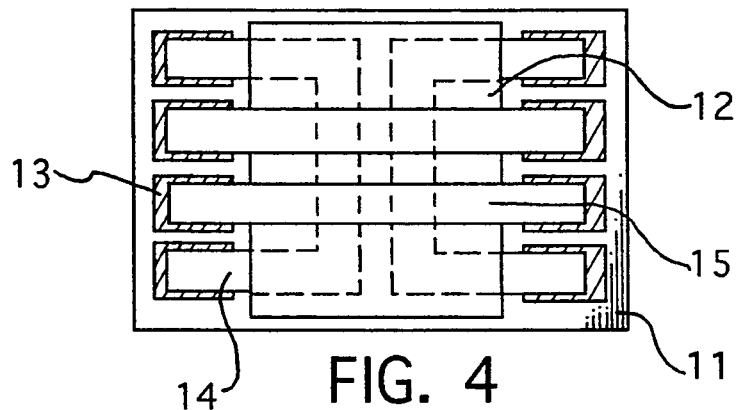
FIG. 4 is a pictorial representation and a top view of four of the sandwich devices of FIG. 1 in more detail.

FIG. 4 shows a device prepared in accordance with this example. To prepare such a device, eight contact pads 13 were applied to a 1"×1.5" Corning ® 7059 glass slide 11 by a silk screening process using a gold frit paste which was conductive coating 8835 manufactured by Electroscience Laboratories. The slide 11 with the silk screened contact pads 13 was dried in air at 150° C. and baked at 520° C. for 30 minutes. Back electrodes 14 were deposited across the contact pads. These electrodes 14 were deposited by placing the slide 11 in a deposition chamber which was evacuated to one mPa using liquid nitrogen in a cold trap, establishing an argon glow discharge at a suitable pressure between 1.5 and 3 kV for ten minutes, and evaporating a three nanometer thick layer of chromium and a 180 nanometer thick layer of gold through a stainless steel mask.

The contact pads 13 on the slide 11 were masked and a 135 nm thick silicon dioxide thin film 12 was applied to both the surface of the slide and the electrodes 14. The thin film 12 was applied by diluting hydrogen silsesquioxane resin prepared by the method of Bank in U.S. Pat. No. 5,010,159 to about 10% in a cyclic dimethylpolysiloxane solvent, coating the surface of the slide 11 with the solution, spinning the slide 11 at 3000 RPM for ten seconds, and pyrolyzing the slide 11 in a furnace in air for three hours at 400° C. to form the thin film.

Top electrodes 15 were deposited on the thin film 12 by the same process by placing the slide 11 in a deposition chamber which was evacuated to one mPa using liquid nitrogen in a cold trap and evaporating a 100 nm thick layer of gold through a stainless steel mask. The area of the device was 0.15 cm$^2$.

Figure 4A:
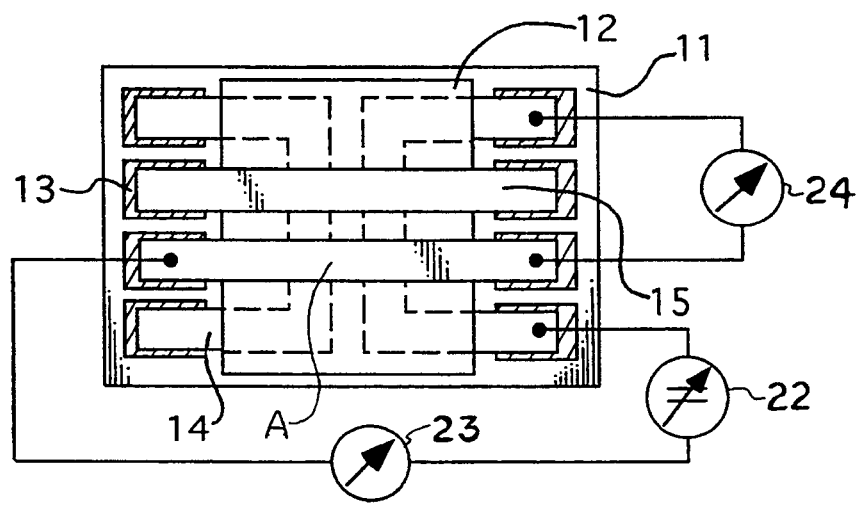
FIG. 4A is a schematic wiring diagram of the device of FIG. 4 for measuring the jV curve of the device.

The device was mounted in a measurement chamber where the electrodes 14 and 15 of one of tile four devices were connected to measuring equipment by applying wires to the contacts 13 as depicted in FIG. 4A. The chamber was purged with nitrogen and a variable voltage was applied across the thin film. The voltage V across the device and the current I through the device were measured for each voltage and the current density j was calculated from I and the device area A. As shown in FIG. 4A, a variable supply voltage source 22, a current meter 23, and a voltmeter 24, were used to make these measurements.

Figure 5:
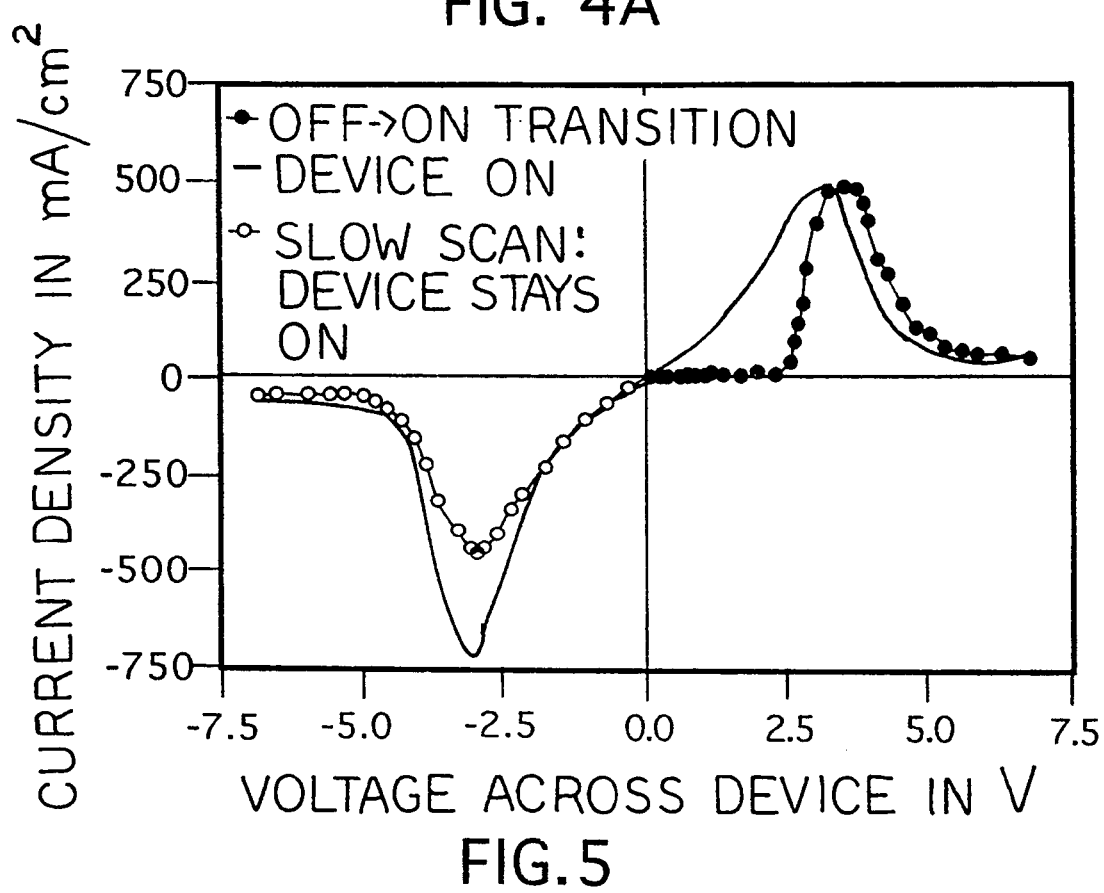
FIG. 5 is another graphical representation in the form of a jV plot of the current density versus the voltage of a typical device of the present invention as depicted in FIGS. 4 and 4A and illustrating the threshold switching behavior of the device as well as the transition of the device from an OFF state to an ON state.

The j-V curve of FIG. 5 was obtained from this device. This curve shows the transition of the device from its OFF state to its ON state, as well as a full curve of the device in its ON state.

EXAMPLE 2

A device was prepared in the same manner as in Example 1 except for the method of film formation. In this Example, the thin film was applied by diluting hydrogen silsesquioxane resin prepared by the method of Bank in U.S. Pat. No. 5,010,159 to about 25% solids in a solvent mixture of five percent by weight of heptane and ninety-five percent by weight of dodecane; coating the surface of the slide 11 and electrodes 14 with this solution, spinning the slide 11 at 3000 RPM for ten seconds, and pyrolyzing the slide 11 in a furnace in air for three hours at 400° C. The resultant film was about 450 nm thick. After the film had cooled, a second thin film was deposited on top of the first thin film in the same manner. The dual layer film was approximately 910 nm thick. Top electrodes 15 were deposited in the same manner as Example 1. The j-V characteristics were measured and showed similar results as Example 1. This Example shows that the thin films of the present invention are not thickness limited as films in the prior art.

EXAMPLE 3

Another device was prepared as in Example 1 except for the method of film formation. In this Example, a coating solution was formed by mixing 0.462 grams of Fe(O$_2$C$_5$H$_7$)$_3$, 0.487 grams of hydrogen silsesquioxane resin prepared by the method of Bank et al. in U.S. Pat. No. 5,010,159, and 9.9 grams of 2,4 pentandione. The solution was coated onto the surface of the slide and electrodes 14, the slide 11 was spun at 1500 RPM for 15 seconds, and the coated slide was pyrolyzed in a furnace in air for one hour at 400° C. Top electrodes were deposited in the same manner as Example 1. The j-V characteristics were measured and showed similar results as Example 1.

COMPARATIVE EXAMPLE 4

Figure 6:
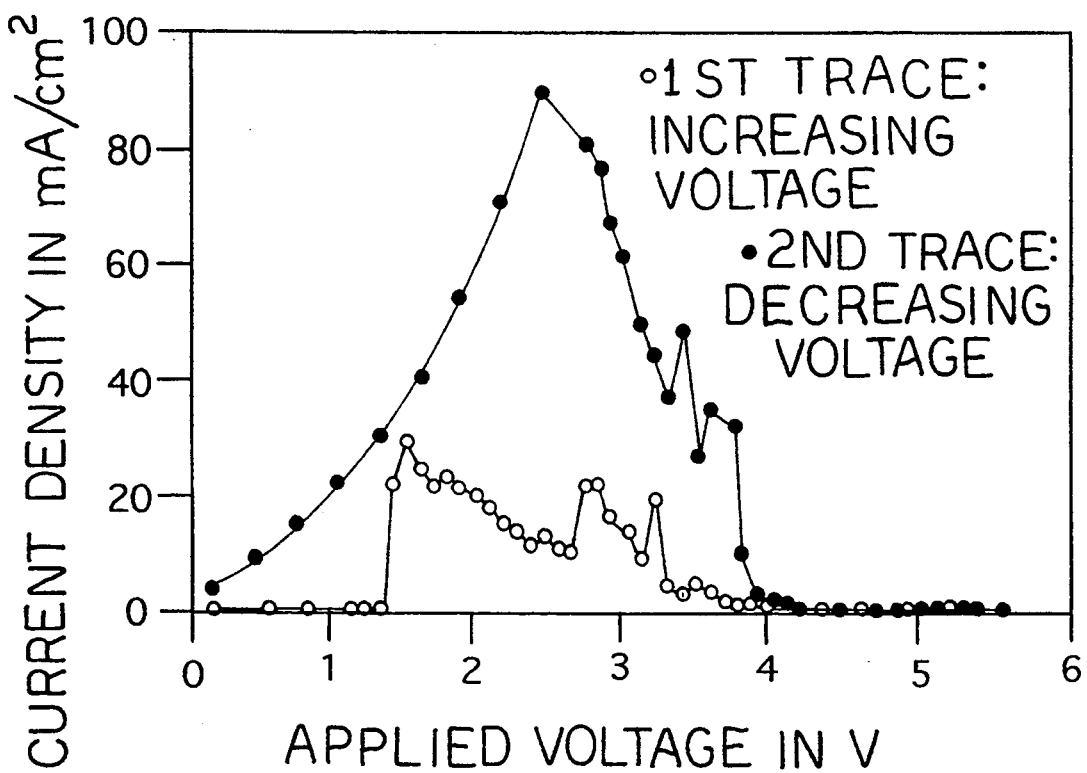
FIG. 6 is yet another graphical representation in the form of a jV plot of the current density versus the voltage of a device. However, FIG. 6 differs from the other jV plots in that it depicts the characteristics of a device not in accordance with the present invention. The purpose of FIG. 6 is to illustrate by comparison the improved results obtained with devices which are according to the invention versus devices as depicted in FIG. 6.

Example 1 was repeated except for the method of film formation. In this Example, tile thin film 12 was formed from Accuglas TM 305 which is an organopolysiloxane by coating the surface of the slide 11 and electrodes 14 with this solution, spinning the slide 11 at 3000 rpm for ten seconds and pyrolyzing the slide 11 in a furnace in air for one hour at 400° C. The resultant film was about 200 nm thick. Top electrodes 15 were deposited in the same manner as Example 1. The j-V characteristics were measured and are shown in FIG. 6. FIG. 6 shows that thin films derived from other silica precursors differ from those derived from a hydrogen silsesquioxane resin. Specifically, FIG. 6 shows that the threshold voltage for the ON transition is much lower, the NDR regime is wide and noisy, and the jV characteristic is erratic.

COMPARATIVE EXAMPLE 5

Figure 7:
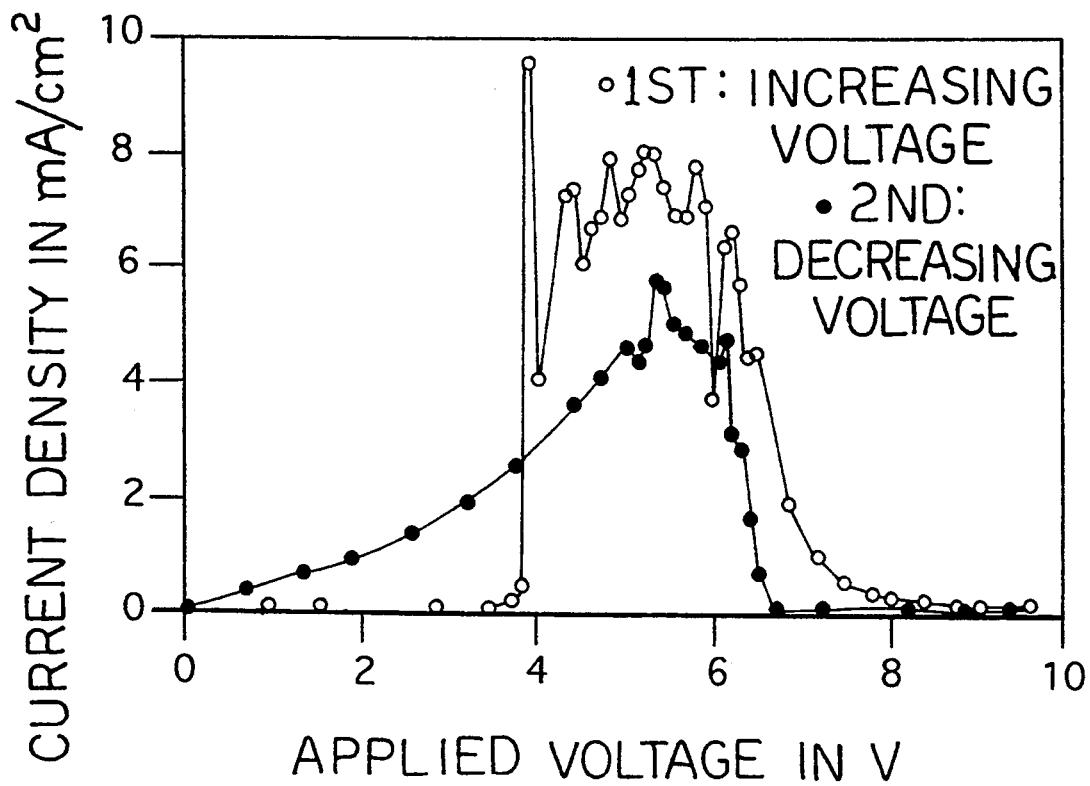
FIG. 7 is still another graphical representation in the form of a jV plot of the current density versus the voltage of another device. However, FIG. 7 differs from the other jV plots in that it depicts the characteristics of another device not in accordance with the present invention. As with FIG. 6, the purpose of FIG. 7 is to further illustrate by comparison the improved results obtained with devices which are according to the invention versus devices as depicted in FIG. 7.

Example 1 was again repeated except for the method of film formation. In this Example, the thin film 12 was formed by a vapor deposition process by placing the slide 11 with the electordes 14 in an electron cyclotron resonance reactor at a substrate temperature of 450° C. A source gas mixture of 25% $SiH_4$ and 75% argon and oxygen with a ratio of $O_2:SiH_4$ of 2.2:1 was admitted into the reactor at a total pressure of one Pa, and a microwave plasma was maintained in the reactor at a power of 400 W for twelve minutes. The resultant film was about 170 nm thick. Top electrodes 15 were deposited in the same manner as Example 1. The j-V characteristics were measured and are shown in FIG. 7. FIG. 7 shows that thin films 12 formed by chemical vapor deposition differ from those derived from a hydrogen silsesquioxane resin. Specifically, FIG. 7 shows (i) a low ON current and a small ON/OFF ratio, (ii) higher threshold voltages for ON transitions, (iii) a steep NDR regime, and (iv) a jV characteristic which is erratic.

EXAMPLE 6

Figure 11:
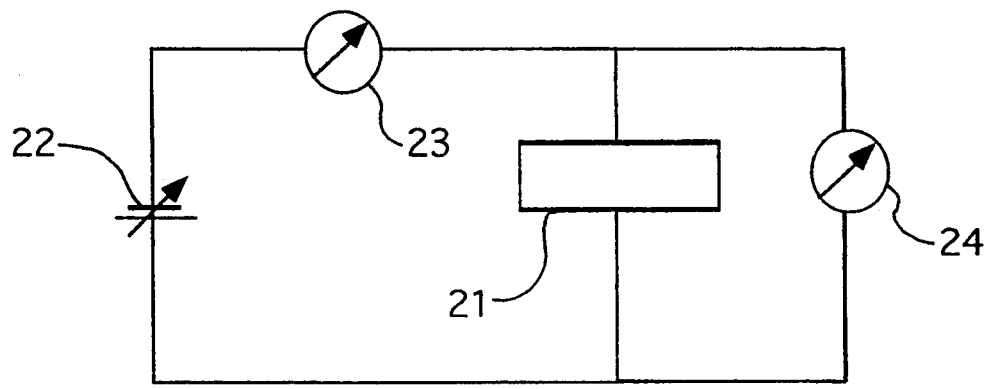
FIG. 11 is a schematic wiring diagram of a device according to the present invention in a test circuit for measuring and changing the resistance of the device in an application of the device as a resistor.

The device of Example 1 was placed in an electrical circuit as illustrated in FIG. 11 to show its use as a resistor. The device 21 was connected to a variable voltage source 22 with a current meter 23 wired in series. The current meter 23 was a calibrated measurement resistor and a voltmeter to measure the voltage drop. A voltmeter 24 connected across the two terminals of the device measured the voltage applied to the device.

The variable voltage source 22 provided two functions:

(i) It served as a voltage source to which the variable resistor was connected to obtain a current according to the device resistance at voltages below the threshold voltage of the device. In this mode, the jV curves of the resistor at its two extreme resistance values were obtained and are shown in FIGS. 8 and 9.

(ii) The voltage source 22 also served as the source for the pulse voltages with which the resistance of the variable resistor device was altered according to the resistor characteristic shown in FIG. 9. The data points were obtained by pulsing the resistor with a voltage (abscissa values) and measuring the current through the resistor at an applied voltage of one volt. The resistance calculated from the measured values were plotted logarithmically on the ordinate.

EXAMPLE 7

Figure 12:
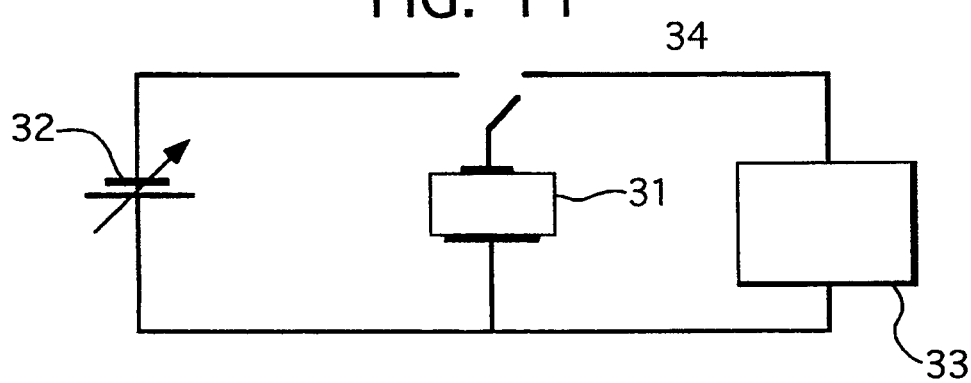
FIG. 12 is a schematic wiring diagram of a device according to present invention in a test circuit in which the device functions as a capacitor in an electrical or electronic circuit.

A device according to Example 1 of the present invention was connected as a two terminal component in order to depict its use as a capacitor in an electrical or electronic circuit. Such an arrangement is shown in the test circuit of FIG. 12. In FIG. 12, the variable capacitor device 31 which had a device area of 0.15 $cm^2$ was arranged in the circuit to enable it to be connected either to a variable voltage source 32 or to a capacitance meter 33 by manipulation of selector switch 34. The capacitance meter 33 was a variable frequency capacitance bridge, but any suitable capacitance measurement instrument can be employed. In this example, meter 33 was a Hewlett-Packard 4194A Impedance Analyzer. The features of the device 31 in the circuit of FIG. 12 sought to be illustrated were the value of the capacitance of the device 31, and the procedure for changing the capacitance of the device 31 from a high value of the device in its ON state and a low volume of the device in its OFF state.

As depicted in FIG. 12, the switch 34 was set to connect the device 31 to the capacitance meter 33. In this position, a small probe voltage of about ten millivolts at a selected frequency between 100 Hz and 100 kHz was applied to the terminals of the device 31. A bias voltage was also applied in order to determine the capacitance of the device 31 as a function of its voltage, and this relationship is depicted graphically as a capacitance-voltage (CV) curve in FIG. 13. The value of the bias voltage was selected in order that the limits of the threshold voltage "x", which was between plus or minus 1.5 to 2.0 volts in either polarity, was not exceeded. The upper trace in FIG. 13 reveals a measurement of the capacitance of the device 31 in its ON state as a function of bias between $-1.5$ and $+1.5$ volts. The measurement in this instance was carried out at a frequency of 10 kHz. The capacitance at zero bias was 4.6 nF.

In FIG. 12, the switch 34 was manipulated in order to connect the device 31 to the variable voltage pulse source 32. The capacitance of the device in this mode was changed by the application of a voltage above the threshold voltage "x" of about two to three volts. It was necessary to remove the voltage in one step rather than to lower the voltage slowly. A voltage pulse with rise and fall times of a few milliseconds or less was used for this purpose. After the capacitance of the device 31 was changed, the switch 34 was set to connect the device 31 to the capacitance meter 31. The lower trace in FIG. 13 shows the device 31 after a voltage pulse of 10 volt was applied in order to turn the device 31 OFF. The capacitance of the device 31 was again measured as a function of bias between $-1.5$ and $+1.5$ volt at a frequency of ten kHz. The capacitance of the device 31 at zero bias was determined to be 0.72 nF. This was a reduction of the capacitance of the device 31 by a factor of six.

It should be noted from the foregoing, that the voltage pulse not only changed the capacitance at zero bias, but that the capacitance-voltage characteristic of the device was also changed significantly over the bias range as can be seen from the CV curve in FIG. 13. It is also significant to note that the voltage pulse for changing the capacitance from high to low was applied to the same two electrodes which constitute the contacts 10 and 20 of the device, and that no additional control electrodes were required.

In summary and with reference again to FIGS. 2 and 3, it should be noted that a device according to the present invention is capable of existing in two stable states. Thus, an ON state provides high conductance (low resistance), whereas an OFF state provides low conductance (high resistance). Transitions between the ON state and the OFF state are induced by the application of voltage pulses. As can be seen in FIGS. 2 and 3, jV curves for such devices exhibit both linear and non-linear components dependent upon the state of the device.

Initially, as a voltages below a threshold voltage "x" are applied to the device in the OFF state, the current follows an essentially linear relationship along line 1. When the threshold voltage "x" is reached however, line 1a in FIGS. 2 and 3 indicates a rapid linear transition from the OFF state of the device to ON state in which the current varies in a non-linear fashion. As the voltage is increased beyond the threshold voltage "x", a current maximum or current peak "p" is reached at voltage "y".

Once the ON characteristic of the device is established, a decrease of the voltage from "y" to zero for example, causes the current to decrease along line 2 rather than retracing lines 1a and 1. On the other hand, voltage increases beyond "y" effect a decrease of current along line 3 to the current minimum or current valley "q" at voltage "z". Horizontal tangents drawn on the curve at points "p" and "q" define the NDR or the region of negative differential resistance along line 3 between the tangents.

Until the voltage exceeds the voltage "z", the device remains in the ON state and is free to cycle slowly along lines 2 and 3. The device may be switched to the OFF state by increasing the voltage beyond "z" to "w" for example, and rapidly removing the applied voltage. This causes the current to decrease to zero at a lower current level and in an essentially linear fashion from the return point "r" in FIG. 3 in a path along lines 4, 5, and 1. The device remains in the OFF state as long as the magnitude of any subsequently applied voltage, either positive or negative, does not exceed the threshold voltage "x". If the subsequently applied voltage does exceed the threshold voltage "x" the device is switched back to the ON state.

The jV curves according to FIGS. 2 and 3 therefore can be seen to exhibit both linear and non-linear regions for a device. The jV curve has a first non-linear region 2 wherein increasing the voltage applied to the device increases the current to a current maximum or peak "p", followed by a second non-linear region of negative differential resistance 3 wherein increasing voltage applied to the device decreases the current to a current minimum or valley "q", while the voltage is increasing.

The jV curve has a third region 5 capable of being activating by a voltage in excess of the voltage "z" at the current minimum "q", at which time a rapid removal of an applied voltage "w" causes the current to decrease from point "r" in a linear fashion along lines 5 and 1.

The jV curve has a fourth region 1a wherein an increase of voltage applied to the device up to a threshold voltage "x" causes a rapid transition from a linear current increase to a non-linear increase in region 2 up to a current maximum or peak "p" at which peak "p" regions 2 and 3 merge.

Other variations and modifications may be made in the compounds, compositions, methods, devices, and articles of manufacture, described herein without departing from the essential features and concepts of the present invention. The forms of the invention described herein are exemplary only and are mot intended as limitations on the scope of the invention as defined in the appended claims.

That which is claimed is:

1. In an electrical or electronic circuit having at least one capacitor device connected in the circuit by at least a pair of electrodes, the improvement comprising a variable capacitor device in the form of a silicon dioxide film derived from the oxidation of a hydrogen silsesquioxane resin, the silicon dioxide film being characterized by a jV curve which includes both linear and non-linear regions for the device, the jV curve of the silicon dioxide film including: (i) a first non-linear region wherein increasing the voltage applied to the device increases the current to a current maximum, at which time a measurement of the capacitance of the device shows a high value and a strong dependence on the applied bias; followed by (ii) a second non-linear region of a negative differential resistance wherein increasing the voltage applied to the device decreases the current to a current minimum while the voltage is increasing; the jV curve of the silicon dioxide film including (iii) a third region capable of being activated by a voltage in excess of the voltage at the current minimum, at which time a rapid removal of the excess voltage causes the current to decrease in an essentially linear fashion which switches the capacitance of the device from the high value and the strong dependence on the applied bias to a low value and a weak dependence on the applied bias; the jV curve of the silicon dioxide film further including (iv) a fourth region wherein an increase of the voltage applied to the device up to a threshold voltage causes a rapid transition from a linear current increase to n non-linear current increase which continues to a current maximum.

2. The circuit of claim 1 wherein the variable capacitor device is placed in a non-oxidizing atmosphere.

3. The circuit of claim 1 wherein the film is formed by a process which comprises coating a substrate with a solution of a hydrogen silsesquioxane in a solvent, evaporating the solvent to form a coating, and pyrolyzing the coating to form the film.

4. The circuit of claim 3 wherein the coating is pyrolyzed at a temperature in the range of from about 100° C. to about 600° C.

5. The circuit of claim 3 wherein the solution contains a catalyst selected from the group consisting of platinum, rhodium and copper in an amount of about 5 to about 1000 ppm based on the weight of hydrogen silsesquioxane resin.

6. The circuit of claim 1 wherein the electrodes are separated by a distance of less than about 5000 nm.

7. The circuit of claim 1 wherein the film has a density between about 0.9 and about 2.1 g/cc.

8. The circuit of claim 1 wherein the electrodes are a material selected from the group consisting of gold, aluminum, silver, copper, platinum, nickel, cobalt, gallium arsenide, and silicon.

9. The circuit of claim 3 wherein the substrate is a material selected from the group consisting of gold, aluminum, silver, copper, platinum, nickel, cobalt, gallium arsenide, silicon, silicon carbide, silica, alumina, aluminum nitride, and silicon nitride.

10. The circuit of claim 8 wherein the electrodes are gold.

11. The circuit of claim 1 wherein the film thickness is between about 50 and about 5000 nm.

12. The circuit of claim 11 wherein the film thickness is between about 100 and about 600 nm.

13. The circuit of claim 1 wherein one or more modifying ceramic oxides are incorporated in the film.

14. The circuit of claim 13 wherein tile modifying ceramic oxide is an element selected from the group consisting of iron, titanium, zirconium, aluminum, tantalum, vanadium, niobium, boron and phosphorous, present in an amount such that the film contains 0.1 to 30 percent by weight of the modifying ceramic oxide.

* * * * *